United States Patent
Tanaka et al.

(10) Patent No.: US 6,953,761 B2
(45) Date of Patent: Oct. 11, 2005

(54) ALUMINUM NITRIDE SINTERED BODY AND SUBSTRATE FOR ELECTRONIC DEVICES

(75) Inventors: Shigeru Tanaka, Hitachi (JP); Akio Chiba, Hitachi (JP); Yasutaka Suzuki, Taga (JP); Kazuhiro Hirose, Hitachinaka (JP); Tamihito Kawahigashi, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 51 days.

(21) Appl. No.: 10/629,681

(22) Filed: Jul. 30, 2003

(65) Prior Publication Data
US 2004/0126598 A1 Jul. 1, 2004

(30) Foreign Application Priority Data
Dec. 27, 2002 (JP) ........................... 2002-381630

(51) Int. Cl.[7] ................ C04B 35/581; B32B 9/00; B32B 15/04
(52) U.S. Cl. ................ 501/98.4; 428/469; 428/698
(58) Field of Search ............... 501/98.4–98.6; 428/469, 698

(56) References Cited

U.S. PATENT DOCUMENTS 6,174,614 B1 * 1/2001 Yushio et al. ............... 428/698
6,689,498 B2 * 2/2004 Shinosawa et al. ......... 428/698
6,800,576 B2 * 10/2004 Katsuda et al. ............ 501/98.4

FOREIGN PATENT DOCUMENTS

| JP | 61-216243 | 9/1986 |
| JP | 02-038368 | 2/1990 |
| JP | 02-092869 | 4/1990 |
| JP | 05-058744 | 3/1993 |
| JP | 07-069732 | 3/1995 |
| JP | 08-157264 | 6/1996 |
| JP | 11-092229 | 4/1999 |
| JP | 2002-097075 | 4/2002 |

* cited by examiner

Primary Examiner—Karl Group
(74) Attorney, Agent, or Firm—McDermott Will & Emery LLP

(57) ABSTRACT

An aluminum nitride sintered body produced by sintering under pressure of a powder composition comprising aluminum nitride and 5 to 30% by weight of at least one sintering aid selected from the group consisting of Nd, Sm, Eu, Er, Dy, Gd, Pr and Yb, per 100% by weight of the powders of aluminum nitride and the sintering aid, wherein the amount of the sintering aid is a conversion value as oxides of the elements, the sintering body that has been subjected to mirror-polishing having a surface roughness R max of 0.2 $\mu$m or less and a thermal conductivity of 200 (W/mK) or more.

20 Claims, 2 Drawing Sheets

ALUMINUM NITRIDE SINTERED BODY AND SUBSTRATE FOR ELECTRONIC DEVICES

DESCRIPTION OF THE INVENTION

1. Field of the Invention

The present invention relates to a new aluminum nitride sintered body (hereinafter referred to as Aln for simplicity), a substrate for electronic devices, a laser light generation device and a semiconductor device.

2. Description of Prior Art

Ceramic sintered materials have advantages such as higher mechanical strength, superior thermal resistance, better abrasion resistance, light weight, etc over conventional metallic materials. These ceramic materials have widely been used or have been tried to use as substrates for electronic devices such as semiconductor devices or electronic circuit modules.

Since in these applications a mounting density is becoming larger year by year, it is necessary to effectively dissipate heat generated in components or wirings or metallic films on the substrates of the devices. Among the ceramic materials, Aln sintered bodies have particularly high heat conductivity and electrical insulation; since they have a linear thermal expansion coefficient close to that of silicon, they are useful materials for substrates of electronic devices such as semiconductor modules and laser light generation devices.

Japanese Patent Laid-open 05-58744 (1993) discloses colored AlN sintered bodies obtained from a powder composition comprising AlN, a coloring agent and an amount of 0.1 to 3.0% by weight of at least one oxide of Ti, Zr, Hf, Ta, Cr, Mo, W, Mn, Fe, Co, Ni, Nd and Ho. The composition is sintered at 1600 to 2000° C. in nitrogen gas stream.

Japanese Patent Laid-open 08-157264 (1996) discloses Aln sintered bodies obtained by sintering at 1650 to 1780° C. in a non-oxidative atmosphere a powder composition containing AlN, a glass frit in an amount of 0.1 to 1% by weight and oxides of IIIa elements in an amount of 1 to 10% by weight.

Japanese Patent laid-open 11-92229 (1999) discloses Aln sintered bodies obtained by sintering at 1550–2050° C. in a reducing atmosphere a powder composition containing rare earth elements in an amount of 0.01 to 15% by weight.

None of the prior art mentioned-above discloses a sintering method under pressure, and the surface conditions of the sintered bodies of the sintered bodies are not disclosed either. The surface conditions are particularly important for applications of electronic devices. Although AlN sintered bodies obtained by conventional method under no pressure have a quite high density, the polished surface of the sintered bodies are poor for application of electronic devices such as laser light generation devices.

SUMMARY OF THE INVENTION

Although Aln single crystal has a theoretical thermal conductivity of 320 W/mK, single crystal is not proper for practical industry application because of its high production cost. Therefore, sintered Aln ceramics (poly-crystals) has been used. In the conventional sintered Aln ceramics, a sintering aid such as $Y_2O_3$ can give a thermal conductivity of about 200 W/mK or more. As long as thermal conductivity is concerned, AlN poly-crystals are very promising materials.

In the sintered ceramics, powder compositions mixed with a proper binder material are prepared by mixing and molding (pressure molding). The compositions are then sintered at high temperature in various types of atmosphere. The sintered bodies have rough surfaces of about micrometer order as they are sintered. Such bodies having rough surfaces cannot be used as substrates for electronic devices, particularly for laser light generation devices, which require a highly smooth surface, i.e. mirror surface. The rough surface of the sintered bodies is caused by several causes such as peeling-off of grains, excessive grain growth, etc. Sintering under normal pressure or under low pressure may bring about the crystal gain growth.

In the laser light generation devices, wiring films of the metallic material are formed on the substrate. A laser diode having a thickness of several 10s micrometers is bonded on the wirings. Laser light is emitted from the side face of the diode; and the surface of the substrate and the metal film surface should have an extremely smooth surface. If there are uneven portions on the surface of the sintered bodies, the uneven surface will be projected on the wiring films. The uneven surface will interfere with the emission of laser light.

The biggest factor that affects the smoothness of the surface of the sintered bodies is marks of peeling-off of crystal grains on the surface. The mirror-polishing of the sintered bodies may form the marks. If the number of the marks or a surface roughness is larger than a certain value, such sintered bodies would not be accepted as substrates. Further, in the ordinary semiconductor devices, satisfactory fine wirings cannot be formed on the substrates. Accordingly, the number of the marks and their size should be as small as possible.

The present invention will solve one or more of the above-mentioned problems.

DETAILED DESCRIPTION OF THE INVENTION

Figure 1:
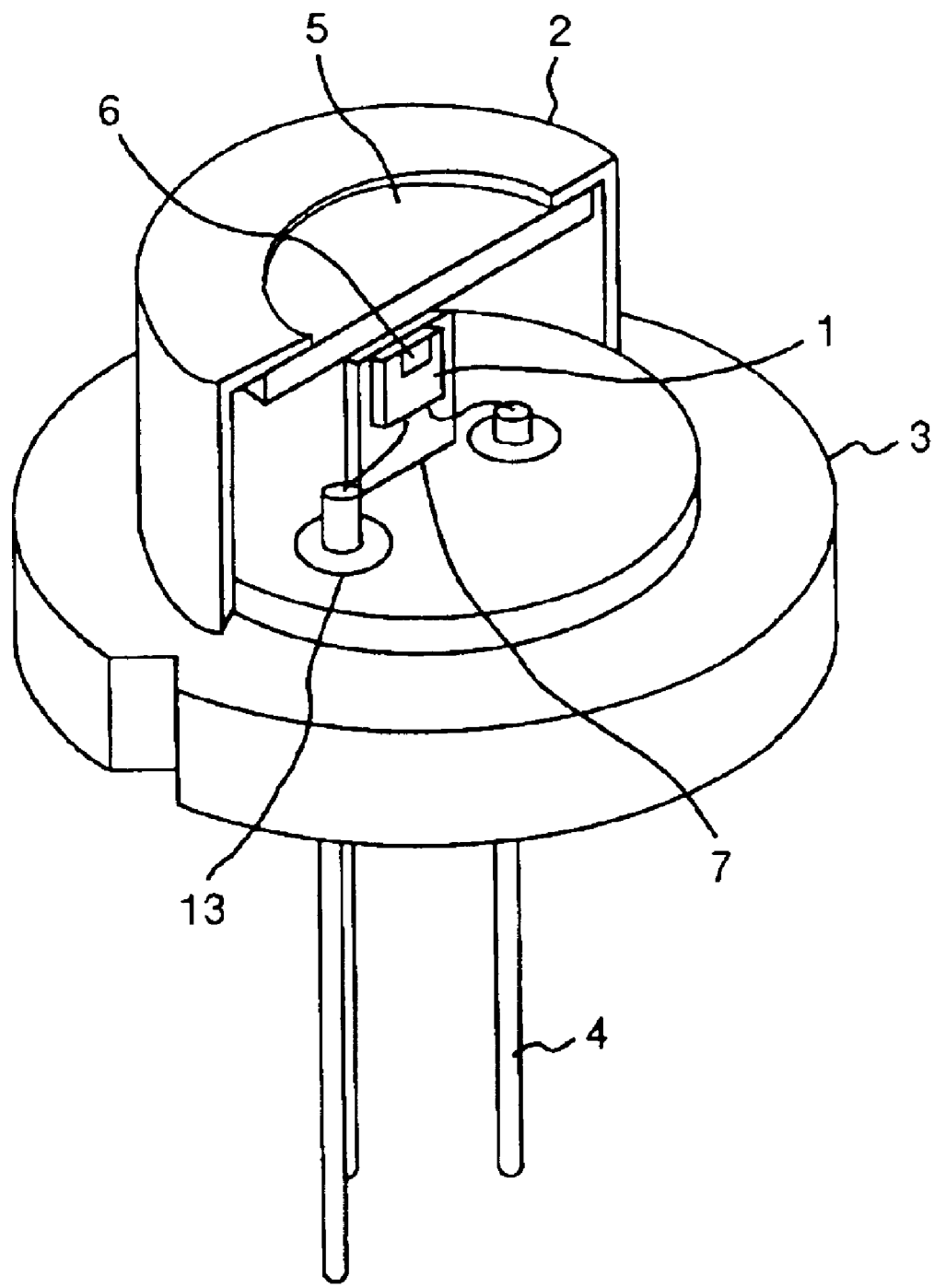
FIG. 1 is a perspective view of a laser light generation device according to the present invention.

The present invention is directed to an Aln sintered body obtained by sintering under pressure a powder composition comprising AlN powder, and a sintering aid in an amount of 5 to 30% by weight of the powder composition, wherein the sintering aid is at least one member selected from the group consisting of specified rare earth elements, and wherein the sintered body that has been subjected to mirror-polishing treatment has a surface roughness R max of 0.2 μm or less and a thermal conductivity of 200 W/mK or more.

The surface of the roughness R max in this specification is a value measured by means of a surface measurement device under the name of SV-600 manufactured by Mitsutoyo, Corporation, Japan. The value 0.2 μm is the maximum value at which the surface of the sintered bodies starts to exhibit mirror surface. The smaller the R max value, the better the mirror surface is expected. If the surface has a roughness is over 0.2 μm, the sintered bodies lose mirror surface, and they are not proper for substrates of electronic devices, particularly laser light generation devices. The surface roughness of 0.15 μm or less gives better results to electronic devices, and the surface roughness of 0.10 μm or less will give best results.

The sintered bodies are cut and divided into desired sizes, and the surface of the plate or pellets are mirror-polished using a polishing material and a polishing method. The final polishing is carried out using finest lapping tapes such as #4000 lapping tape. The roughness of the surface means one that is obtained by the final polishing.

In the conventional Aln sintered bodies, sintering methods are carried out under no-pressure or under normal pressure. In the specification, the pressure sintering or sintering under pressure means method for sintering the composition to which a high mechanical is applied. Thus, the gas atmospheric pressure in the oven or sintering machine does not mean the pressure sintering or sintering under pressure. Since Aln ceramics is easily sintered under no pressure or under a very low pressure, unlike silicon carbide that is hard to be sintered. That is, crystal grain growth takes place under no pressure. The sintering temperature for Aln was about 1800° C. If a hot press machine or HIP machine were used to sinter Aln powder composition, however not ordinary manner to persons skilled in the art, a sintering temperature such as 1600° C. or 1500° C. lower than the sintering under no pressure would be employed in order to save energy for sintering.

Although in the conventional Aln sintered bodies, compounds of Y or Ce were widely used as a sintering aid, these sintering aids may bring about crystal grain growth under pressure. As a result, the surface roughness would be increased. Accordingly, in the present invention, Y or Ce is not a proper sintering aid, though only a small amount of Y and Ce may be contained in the powder composition, as far as it is added together with the sintering aids selected in the present invention. That is, Y or Ce should be 10% or less by weight of the sintering aid. The sintering aids listed in the present invention do not excessively cause crystal gain growth.

The reasons of the excellent surface conditions, i.e. small R max value and less peeling-off of crystal gains caused by mirror-polishing are that the strengthening of bonding between crystal grains by the pressure sintering, and excessive crystal grain growth is avoided because of the pressure sintering and selection of the proper sintering aids.

One of the features of the sintered Aln bodies of the present invention resides in the selection of at least one of Nd, Sm, Eu, Gd, Er, Pr, Dy and Yb. These elements are used as elements, their oxides, nitrides, and other compounds for starting materials. Among the elements, Nd, Sm Eu and Gd are preferable ones, and Nd is most preferable element.

The second feature is that an amount of the sintering aid is from 5 to 30% by weight in the powder composition. Especially, 10 to 20% by weight is preferable in view of cost and characteristics of the sintered bodies. An amount of the sintering aids is a value of conversion as that of oxides of the elements, and the % by weight is based on the powder composition comprising Aln and the sintering aid.

The specific sintering aids selected in the present invention have not actually used in a pressure sintering method, although the above-mentioned prior art simply cited the sintering aids. Especially, the surface condition of the sintered bodies have not discussed at all.

Since the sintering aids are lost from the sintered bodies during sintering under pressure. The amount of the sintering aids remaining in the sintered bodies depends on sintering conditions, such as temperature, sintering pressure, gas atmosphere, etc, but the amount of the sintering aids in the sintered bodies is from 0.05 to 5% by weight of the sintered bodies. Preferably, 0.07 to 0.5% by weight is preferable.

Another feature of the present invention is employment of high-temperature—pressure sintering that has not actually been used in the sintering of AlN. Since Aln ceramics is known as an easy-sintering ceramics, the pressure sintering such as hot press sintering or HIP, which is considered to have low productivity, compared with non-pressure sintering or normal pressure sintering is no longer necessary.

According to the investigation of the inventors of the present invention, when the above-mentioned sintering aids are employed, the pressure should be 20 MPa or lower, but 40 MPa or lower at 1700° C. or higher, preferably 1850° C. or higher, for one hour or longer. When the sintering is conducted under the above-mentioned conditions, the sintered bodies have almost 100% theoretical density (density of single crystal of AlN), having substantially no voids, substantially no peeling-off of grains. The surface roughness R max is 0.2 $\mu$m or less, and a thermal conductivity is 200 W/mK or more. The most preferable sintering conditions are 1800 to 200 under 25 to 35 MPa for 2 to 10 hours, in a non-oxidative atmosphere.

Aln powder used in the present invention should preferably have a particle size of 0.05 to 5 $\mu$m. The powder should be pure as much as possible, as far as its purchase cost or production cost is acceptable. Amounts of free oxygen as an impurity should be less than 5% by weight, preferably 1% b by weight or less in Aln powder so as to obtain sintered bodies with excellent thermal conductivity.

Other impurities such as Si, Fe, Ti, Cr, Co, Ni, Zn, etc should be 10 ppm order or less. The average crystal grain size of the sintered bodies should preferably be 1 to 5 $\mu$m.

The powder composition is mixed with a binder in an amount of 5 to 30% by weight of the composition so as to shape grains or pellets and the powder composition is molded into a desired shape.

Sintering aids such as Y, Ce or La other than ones mentioned-above are not proper sintering aids for the present invention. Even if they are contained, the amount should be 10% by weight or less of the sintering aids selected in the present invention. Preferably, the amount should be 5% by weight or less, and most preferably it should be zero.

The powder composition is prepared by mixing and kneading raw material powders with a binder resin and a solvent such as ethanol for the binder resin. After the solvent is evaporated, the mixing and kneading are carried out by a ball mill mixing. The resulting compound is molded and then sintered under pressure.

In the sintering step, since the density of the sintered bodies obtained by the conventional method under normal pressure or low pressure becomes low, there are wrecks of the bodies during handling. In order to obtain sintered bodies with high reliability, the sintering pressure during sintering is employed. The pressure is applied by a mechanical pressing manner such as hot press, HIP (Hot Isotactic Press), etc. In case of the hot press method, a molded body is placed between a punch and a dice. In order to prevent sticking of the molded to the mold, a separator such as BN is coated on the molded beforehand. In a preferable example of the present invention, carbon plates are inserted between molded plates of the powder composition to prepare a number of sintered bodies. A pressure of 20 to 100 MPA, preferably 30 to 40 MPA, at 1700 to 2000° C., preferably 1800 to 2000° C. for 1 to 8 hours, preferably 2 to 5 hours.

Atmosphere for sintering is nitrogen gas, vacuum or non-oxidative gas such as argon or helium gas. Combinations of the above atmospheres can be employed, too.

As a polishing method of the sintered bodies, lapping paper on the market can be used. As the final polishing, the lapping paper should be as fine grade as possible, for example #4000. After the surface polishing is completed to be mirror surface, it is cleaned in an organic solvent with an ultrasonic cleaner for 1 minute, for example. The surface roughness of the cleaned bodies is measured with the above-mentioned roughness meter.

Even if there are marks of peeling-off of crystal grains in the surface, the bodies are acceptable for substrates of electronic device applications if the surface roughness R max is 0.2 µm or less. If the surface roughness is over 0.2 µm, it is necessary to consider how to use such the sintered bodies. For example, the surface roughness at locations where metallic wirings are formed is over 0.2 µm, the sintered bodies are not accepted as the substrates. If the surface roughness at portions where no wiring is formed is over 0.2 µm, such the bodies may be acceptable. The preferable surface roughness is 0.15 µm or less. The most preferable roughness is 0.1 µm or less.

In some cases, the surface of the bodies may have portions such as lines, dots, spots, etc that have different brightness or colors than other normal portions. Although these portions are not marks of peeling-off of crystal grains, which do not give any adverse affect on the properties of the substrates, the non-uniformity may decrease the quality of the bodies as goods. In this case, if the sintered bodies may be acceptable, the surface area of the non-uniform portions is 5% or less.

DETAILED DESCRIPTION OF THE PREFERRED EMBODIMENTS

EXAMPLE 1

Aln powder having an average particle size of 1 µm and sintering aids having an average particle size of 1 µm were weighted and put in a pot made of engineering plastics to mix thoroughly by means of alumina balls (purity; 99.5%) for 20 hours. In this step, ethanol was added to the powder as a solvent. The mixed powder was left for one night, and then mixed with an organic binder. After the mixture was pelletized, it was molded into plates having a diameter of 60 mm with a hand press machine.

Each of the molded plates was sandwiched with a carbon dice and carbon punch. The inner surface of the carbon dice was coated with BN powder by spraying. The plated were sintered in nitrogen gas atmosphere. A sintering pressure was 30 to 35 MPa, a sintering temperature 1700 to 2000° C., and a holding time 2 to 5 hours. After holding, a heater was switched off, and the sintered plates were cooled in the oven. The sintered plates were prepared for test pieces having a diameter of 10 mm, and a thickness of 4 mm by a cutting and rough-polishing machine.

A thermal conductivity of the specimens was measured by a laser flash method. A measurement temperature was room temperature. The mirror polishing was evaluated after lapping the specimens with #4000 lapping paper, then the polished specimens were rinsed in ethanol with an ultrasonic cleaner for 1 minute. The surface of the specimens was observed with a microscope. Surface roughness of specimens of 2 mm×2 mm was measured with the above mentioned roughness meter.

Specimens having a roughness R max of 0.2 µm or less were evaluated as good mirror polishing property, and R max exceeding 0.2 µm were evaluated as bad mirror polishing property.

In Table 1, there are shown components of powder compositions, sintering conditions and properties of the sintered bodies. Amounts of sintering aids remaining in the sintered specimens were 0.07 to 1.5% by weight.

TABLE 1

| No. | Sintering aid (% based on powder composition) | Sintering conditions (° C. × h) | Thermal conductivity (W/mK) | Surface roughness R max (µ) |
|---|---|---|---|---|
| 1 | $Pr_2O_3$ (10) | 1700, 3 h | 210 | Less than 0.2 |
| 2 | $Pr_2O_3$ (20) | 1800, 3 h | 205 | 0.1 |
| 3 | $Pr_2O_3$ (30) | 1800, 4 h | 225 | Less than 0.15 |
| 4 | $Nd_2O_3$ (12) | 1950, 3 h | 220 | Less than 0.2 |
| 5 | $Eu_2O_3$ (20) | 2000, 5 h | 210 | 0.1 |
| 6 | $Gd_2O_3$ (15) | 1900, 5 h | 220 | Less than 0.15 |
| 7 | $Dy_2O_3$ (18) | 1900, 5 h | 200 | Less than 0.15 |
| 8 | $Dy_2O_3$ (30) | 1950, 5 h | 200 | Less 0.15 |
| 9 | $Er_2O_3$ (15) | 1850, 4 h | 210 | Less than 0.2 |
| 10 | $Yb_2O_3$ (20) | 1950, 3 h | 215 | Less than 0.15 |
| 11 | $Pr_2O_3$ (7) | 1950, 3 h | 210 | Less than 0.2 |
| 12 | $Sm_2O_3$ (10) | 1950, 4 h | 220 | Less than 0.2 |
| 13 | $Pr_2O_3$ (35) | 1800, 4 h | 220 | More than 0.2 |
| 14 | $Dy_2O_3$ (35) | 1950, 5 h | 200 | More than 0.2 |
| 15 | $Y_2O_3$ (10) | 1700, 3 h | 195 | More than 0.2 |
| 16 | $Ce_2O_3$ (15) | 1850, 5 h | 200 | More than 0.2 |

As is apparent from Table 1, specimen Nos. 2 to 4 that contain $Pr_2O_3$ exhibit such a high thermal conductivity as 200 W/mK or more. The surface roughness of the samples was 0.2 µm or more.

When only $Y_2O_3$ or $Ce_2O_3$ was added as seen in samples 15 and 16, the thermal conductivity was 195 or 200 W/mK or the surface roughness was not good.

When Pr, Nd, Eu, Gd, Dy, Yb or Sm was added within an amount of 10 to 30% by weight, the thermal conductivity was 200 W/mK or more, and there were only few marks of peeling-off of crystal grains, and the surface roughness R max was 0.2 µm or less.

If the additive amount is more than 30% by weight, the mirror polishing workability will slightly be decreased and will increase cost of the sintered bodies.

EXAMPLE 2

Aln sintered bodies were prepared by the same manner as in Example 1, and thermal conductivity and mirror workability of the sintered bodies were investigated. Sintering aids contained different kinds of rare earth elements and $Y_2O_3$ and $Ce_2O_3$, shown in Table 2. Amounts of sintering aids remaining in the sintered bodies were 0.05 to 1% by weight.

TABLE 2

| No. | Sintering aids (% by weight of powder composition) | Sintering conditions (° C. × h) | Thermal conductivity (W/m · K) | Surface roughness R max (µm) |
|---|---|---|---|---|
| 17 | $Nd_2O_3$ (18) —$Y_2O_3$ (2) | 1950, 4 h | 200 | Les than 0.15 |
| 18 | $Nd_2O_3$ (18) —$Y_2O_3$ (2) | 1900, 4 h | 205 | Less than 0.2 |
| 19 | $Nd_2O_3$ (19) —$Y_2O_3$ (1) | 1850, 5 h | 205 | Less than 0.2 |
| 20 | $Pr_2O_3$ (18) —$Ce_2O_3$ (2) | 2000, 3 h | 220 | Less than 0.15 |
| 21 | $Pr_2O_3$ (18) —$Ce_2O_3$ (2) | 1900, 4 h | 210 | Less than 0.2 |

TABLE 2-continued

| No. | Sintering aids (% by weight of powder composition) | Sintering conditions (° C. × h) | Thermal conductivity (W/m · K) | Surface roughness R max (μm) |
|---|---|---|---|---|
| 22 | $Pr_2O_3$ (25)—$Ce_2O_3$ (10) | 1850, 5 h | 210 | 0.3 |
| 23 | $Pr_2O_3$ (6.5)—$Ce_2O_3$ (0.5) | 1800, 4 h | 200 | Less than 0.2 |
| 24 | $Dy_2O_3$ (10)—$Nd_2O_3$ (10) | 1950, 4 h | 210 | 0.1 |
| 25 | $Pr_2O_3$ (10)—$Nd_2O_3$ (8)—$Ce_2O_3$ (2) | 2000, 3 h | 210 | Less than 0.15 |

As is understood from Table 2, the sintered bodies that contain $Y_2O_3$ $Ce_2O_3$ together with other specific rare earth elements exhibit excellent properties, as far as the amount of $Y_2O_3$ or $Ce_2O_3$ is limited to a certain degree.

On the other hand, sample No. 22 contain a large amount of $Ce_2O_3$; the sintered bodies exhibit thermal conductivity of 210 W/mK, but they exhibited surface roughness R max of larger than 0.2 μm that means poor mirror-polishing workability.

Other samples exhibited thermal conductivity of 200 W/mK or more and the surface roughness R max of 0.2 μm or less.

EXAMPLE 3

Pressed moldings were prepared by the method of Examples 1 and 2 using the powder composition of No. 17 of Example 2. The size of the moldings was 15 mm in diameter and 3 mm in thickness. The moldings were placed in a crucible made of carbon with a lid and the crucible was set in a HIP apparatus to sinter them.

The atmosphere for sintering was nitrogen gas; atmospheric pressure 100 Pa; a sintering temperature was 1800° C.; and a holding time was 3 hours. The resulting sintered bodies were subjected to mirror-polishing, and then subjected to evaluation of surface roughness and thermal conductivity, as same as in Examples 1 and 2. The surface roughness was 0.15 μm or less and the thermal conductivity was 210 W/mK. It was confirmed that the HIP method was useful for sintering the Aln ceramics.

EXAMPLE 4

Aln sintered ceramics having a diameter of 100 mm were obtained by the hot press method of Example 2, using the powder composition of sample No. 17 in Example 2. The sintered bodies were cut and rough-polished to obtain square plate samples having a size of 50×50 mm and a thickness of 0.5 mm. The samples were subjected to fine-polishing to make a mirror surface.

A Ti film, Pt film and Au film were coated successively on both surfaces of the samples by evaporation and sputtering. The samples were cut into pellets of 2 mm×2 mm and a thickness of 0.5 mm. The resulting pellets for heat dissipation had the above-mentioned thermal conductivity (200 W/mK or more), and the time for completing polishing to make the mirror surface was about half that of the conventional AIN ceramics that uses $Y_2O_3$ or $Ce_2O_3$ as a sintering aid.

FIG. 1 shows a partial broken-away sectional view of a laser light generation device that uses the heat dissipation pellet of this example. The laser device comprises a stem 3, a laser diode 6, a lead pin 4 connected to the laser diode, and a cap 2 having a transmission window 5 for laser light. The laser diode 6 is soldered to the metallic film on the AIN ceramic heat dissipation substrate 1.

Figure 2:
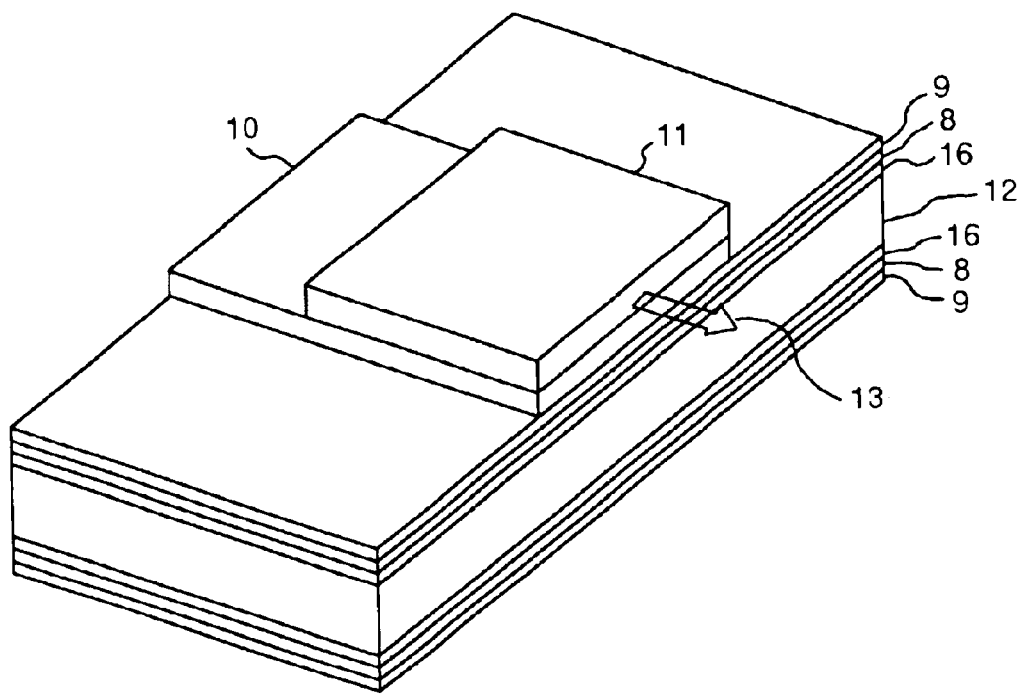
FIG. 2 is a perspective view of an assembly of the laser diode and the heat dissipation substrate used in the device in FIG. 1.

The laser diode and the substrate were bonded to a metal substrate 7 and further bonded to the stem 3. The assembly of the diode and the heat dissipation substrate is shown in FIG. 2. The heat dissipation substrate has on its both faces the three layered metallic film (Ti film 15-Pt film 8-Au film 9). A solder layer 10 of Au—Sn alloy was formed on one of the metallic layer to which the laser diode 11 was bonded. Laser light is emitted from the side face of the diode. Therefore, the surfaces of the Aln ceramic substrate 12 and the metallic films consisting of Ti film 6, Pt film 8 and Au film 9 and the solder layer 10 must be completely mirror surface. Of course, the end face of the substrate must be completely smooth, too.

Figure 3:
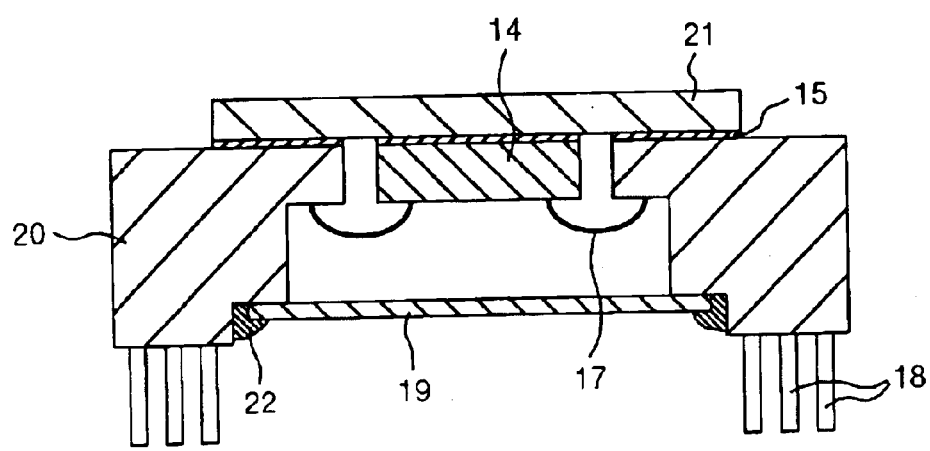
FIG. 3 is a sectional view of a semiconductor device according to the present invention.

FIG. 3 is a sectional view of a semiconductor module device. The module device comprises a packaging 20, a semiconductor element 14 encased in the packaging 20, a lid for covering the semiconductor element 14, a bonding wire 17 for electrically connecting the semiconductor element 14 and wiring, a lead pin 18. Lead pins 18 are disposed on the periphery of the packaging and the semiconductor element 14 is mounted on the heat dissipating substrate 21.

The heat dissipating substrate 21 has its both surfaces metallic films of Pt film 8 and Au film 9, and on the one face a solder layer of Au—Sn alloy was formed. The heat dissipating substrate 21 and the packaging were bonded by the solder 15. The lid 19 was inserted into the step formed in the packaging 20 and bonded with the sealing material 22.

The Aln sintered ceramics can be applied to substrates for circuits for semiconductor modules, heat dissipation substrates for laser light generation devices. Since the Aln sintered ceramic material according to the present invention is excellent in mirror polishing workability and has a high thermal conductivity, the high yielding of the substrates and electronic devices will be attained.

What is claimed is:

1. An aluminum nitride sintered body produced by sintering a powder composition under pressure, the powder composition comprising aluminum nitride and 5 to 30% by weight of at least one sintering aid selected from one or more of the following elements: Nd, Sm, Eu, Er, Dy, Gd, Pr and Yb, per 100% by weight of the powders of aluminum nitride and the sintering aid, wherein the amount of the sintering aid is a conversion value as oxides of the elements, the sintered body that has been subjected to mirror-polishing having a surface roughness R max of 0.2 μm or less and a thermal conductivity of 200 (W/mK) or more.

2. The aluminum nitride sintered body as defined in claim 1, wherein an amount of the sintering aid remaining in the sintered body is 0.05 to 5% by weight, based on the sintered body.

3. The aluminum nitride sintered body as defined in claim 1, wherein a temperature of the sintering is 1800 to 2000° C.

4. The aluminum nitride sintered body as defined in claim 1, wherein the sintering aid is at least one member selected from the group consisting of Nd, Sm, Eu and Gd.

5. The aluminum nitride sintered body as defined in claim 1, wherein an amount of Y and/or Ce in the powder composition is 10% by weight or less as a conversion value of their oxides, based on the powder composition.

6. The aluminum nitride sintered body as defined in claim 1, wherein an amount of Y and Ce in the powder composition is substantially zero.

7. The aluminum nitride sintered body as defined in claim 1, wherein the surface roughness R max is 0.15 μm or less.

8. A substrate for an electronic device comprising a sintered body having been subjected to mirror-polishing, and a metallic film on the surface of the sintered body, the sintered body being aluminum nitride produced by sintering a powder composition under pressure, the powder composition comprising aluminum nitride and 5 to 30% by weight of at least one sintering aid selected from one or more of the following elements: Nd, Sm, Eu, Er, Dy, Gd, Pr and Yb, per 100% by weight of the powders of aluminum nitride and the sintering aid, wherein the amount of the sintering aid is a conversion value as oxides of the elements, the sintered body having a surface roughness R max of 0.2 µm or less and a thermal conductivity of 200 (W/mK) or more.

9. The substrate for an electronic device as defined in claim 8, wherein an amount of the sintering aid in the sintered body is 0.05 to 5% by weight.

10. The substrate for an electronic device as defined in claim 8, wherein a temperature of the sintering is 1800 to 2000° C.

11. The substrate for an electronic device as defined in claim 8, wherein the sintering aid is at least one member selected from the group consisting of Nd, Sm, Eu and Gd.

12. The substrate for an electronic device as defined in claim 8, wherein an amount of Y and Ce in the powder composition is substantially zero.

13. The substrate for an electronic device as defined in claim 8, wherein the surface roughness R max is 0.15.

14. A laser light generating device comprising a substrate having a metallic film thereon and a laser diode mounted on the metallic film, the substrate comprising the metallic film and an aluminum nitride sintered body that has been subjected to mirror-polishing, the sintered body being produced by sintering a powder composition under pressure, the powder composition comprising aluminum nitride and 5 to 30% by weight of at least one sintering aid selected from one or more of the following elements: Nd, Sm, Eu, Er, Dy, Gd, Pr and Yb, per 100% by weight of the powders of aluminum nitride and the sintering aid, wherein the amount of the sintering aid is a conversion value as oxides of the elements, the sintered body having a surface roughness R max of 0.2 µm or less and a thermal conductivity of 200 (W/mK) or more.

15. The laser light generation device as defined in claim 14, wherein an amount of the sintering aid in the sintered body is 0.05 to 5% by weight, based on the sintered body.

16. The laser light generation device as defined in claim 14, wherein a temperature of the sintering is 1800 to 2000° C.

17. The laser light generation device as defined in claim 14, wherein the sintering aid is at least one member selected from the group consisting of Nd, Sm, Eu and Gd.

18. The laser light generation device as defined in claim 14, wherein an amount of Y and Ce in the powder composition is substantially zero.

19. A semiconductor device comprising a substrate having a metallic film thereon and a semiconductor element mounted on the metallic film, the substrate comprising the metallic film and an aluminum nitride sintered body that has been subjected to mirror-polishing, the sintered body being produced by sintering a powder composition under pressure, the powder composition comprising aluminum nitride and 5 to 30% by weight of at least one sintering aid selected from one or more of the following elements: Nd, Sm, Eu, Er, Dy, Gd, Pr and Yb, per 100% by weight of the powders of aluminum nitride and the sintering aid, wherein the amount of the sintering aid is a conversion value as oxides of the elements, the sintered body having a surface roughness R max of 0.2 µm or less and a thermal conductivity of 200 (W/mK) or more.

20. An aluminum nitride sintered body produced by sintering a powder composition under pressure, the powder composition consisting essentially of aluminum nitride and 5 to 30% by weight of at least one sintering aid selected from one or more of the following elements: Nd, Sm, Eu and Gd, per 100% by weight of the powders of aluminum nitride and the sintering aid, wherein the amount of the sintering aid is a conversion value as oxides of the elements, the sintered body that has been subjected to mirror-polishing having a surface roughness R max of 0.2 µm or less and a thermal conductivity of 200 (W/mK) or more.

* * * * *